United States Patent [19]

Zimmerman

[11] Patent Number: 4,812,780
[45] Date of Patent: Mar. 14, 1989

[54] BROADBAND DIFFERENTIAL AMPLIFIER
[75] Inventor: Dale E. Zimmerman, Dallas, Tex.
[73] Assignee: Texas Instruments Incorporated, Dallas, Tex.
[21] Appl. No.: 166,142
[22] Filed: Mar. 10, 1988

Related U.S. Application Data
[63] Continuation-in-part of Ser. No. 855,546, Apr. 23, 1986.
[51] Int. Cl.$^4$ .............................................. H03F 3/45
[52] U.S. Cl. .................................... 330/253; 330/255; 330/258; 330/311
[58] Field of Search ................ 330/253, 255, 258, 311

[56] References Cited
PUBLICATIONS
Wyland, "FET Cascode Technique Optimizes Differential Amplifier Performances", Electronics, Jan. 18, 1971, pp. 81–84.

Primary Examiner—James B. Mullins
Attorney, Agent, or Firm—Carlton H. Hoel; Leo N. Heiting; Melvin Sharp

[57] ABSTRACT

A differential amplifier (230) with input differential dual gate FETs (232,234) with one pair of gates (235,237) tied together, with sources tied together, and with a current source (236,238) for each of the FETs and inputs at the current source terminals is disclosed. These amplifiers provide large CMRR at frequencies to a few GHz, and fabrication in gallium arsenide is disclosed. A push-pull single-ended output stage provides good power handling and VSWR.

12 Claims, 14 Drawing Sheets

Cds = 0.23 fF/μm
Cgd = 0.02 fF/μm
Cgs = 2.0 fF/μm
Gm = 80 μS/μm
Rds = 120 kΩ·μm
Rgs = 2.5 kΩ·μm
Rd = 2.0 kΩ·μm
Rg = 1.0 kΩ·μm
Rs = 1.5 kΩ·μm

CONNECTED AS A 180 DEGREE COMBINER

CONNECTED AS A 180 DEGREE SPLITTER

CONNECTED FOR DIFFERENTIAL INPUT
AND DIFFERENTIAL OUTPUT

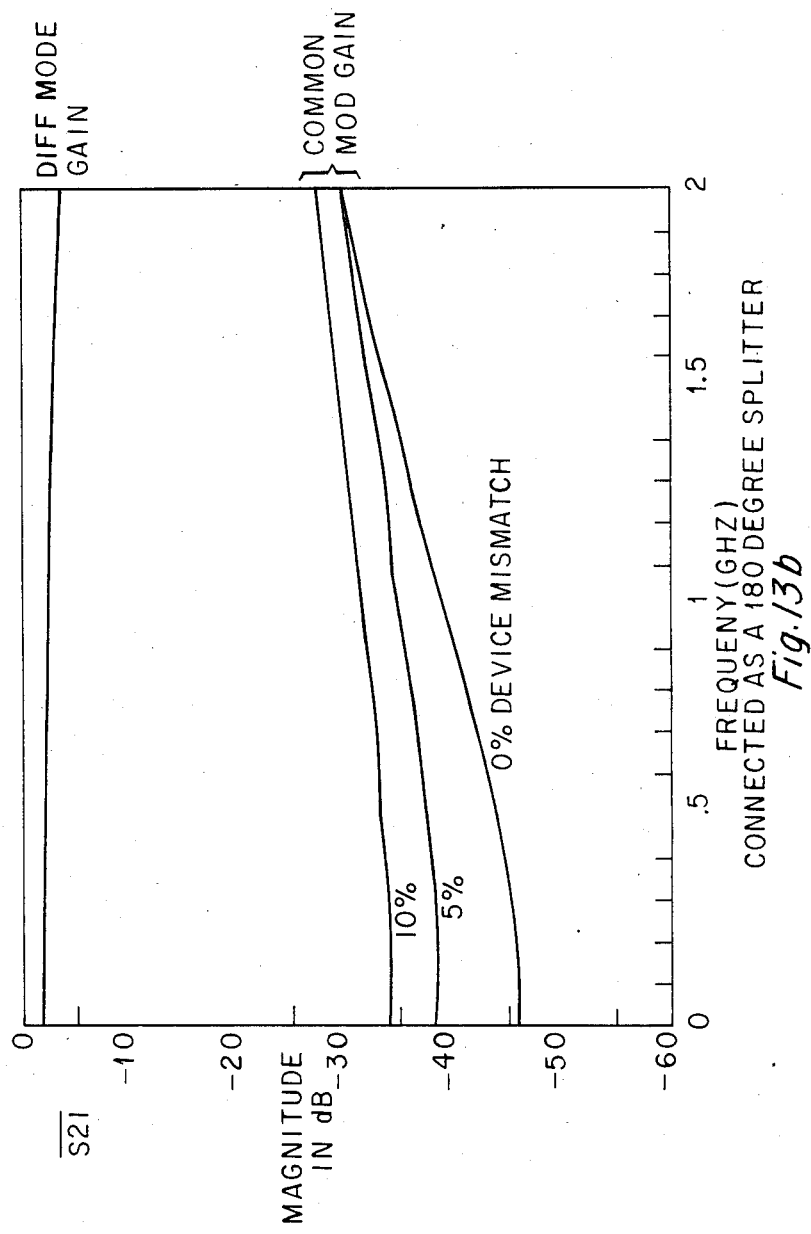

BROADBAND DIFFERENTIAL AMPLIFIER

CROSS-REFERENCE TO RELATED APPLICATIONS

This application is a continuation-in-part of copending U.S. application Ser. No. 855,546, filed Apr. 23, 1986. The cross-referenced application is assigned to the assignee of this application.

BACKGROUND OF THE INVENTION

1. Field of the Invention

The present invention relates to semiconductor electronic devices, and, more particularly, to broadband microwave differential amplifiers.

2. Description of the Related Art

A differential amplifier provides voltage gain to the difference between signals applied to its two input terminals while responding with much lower gain or attenuation to voltages common to the two inputs. Thus desired differential signals are amplified with little effect from extraneous common mode signals. Such extraneous signals frequently arise from signal current flow in long lines or from noise pickup, but they are essentially rejected by the differential amplifier. Further, the differential amplifier provides isolation of input and output quiescent voltage levels by its common mode signal characteristics. Consequently, operational amplifiers, which are basic building blocks for electronic circuits, tyically have differential amplifier input stages. See, generally, J. Graeme and G. Tobey, Eds., Operational Amplifiers: Design and Applications (McGraw-Hill 1972).

The common-mode rejection ratio (CMRR) is a figure of merit for a differential amplifier that compares the gain of signals common to both inputs to the gain of the difference between the signals applied to the inputs. The CMRR is defined as follows: let $v_{i1}$ and $v_{i2}$ be small signal voltages applied to inputs 1 and 2, respectively, of a differential amplifier, and $v_{o1}$ and $v_{o2}$ the output voltages at outputs 1 and 2, respectively; then the differential-mode voltage gain is $$a_d = \frac{v_{o1} - v_{o2}}{v_{i1} - v_{i2}};$$

the common-mode voltage gain is $$a_c = \frac{v_{o1} + v_{o2}}{v_{i1} + v_{i2}};$$

and the CMRR expressed in dB is $$CMRR(dB) = 20 \log \left| \frac{a_d}{a_c} \right|.$$

For a single ended output the same definitions apply but with $v_{o1}$ the output and $v_{o2}=0$.

Commerically available operational amplifiers may have a CMRR in the order of 100 dB; however, such operational amplifiers are effectively limited to operation at low frequencies (below about 100 MHz). But many signal processing and instrumentation systems require a broadband high frequency differential amplifier with a large CMRR; typically a low level signal (differential-mode) must be separated from a large interference signal which is common to both inputs (common-mode) at frequencies above 1 GHz. FIG. 1 is an example of a signal processing application of a differential amplifier in which the output of a surface acoustic wave (SAW) device is detected at frequencies from 100 MHz to 2 GHz. Such amplifiers are not commercially available, and it is a problem to provide a simple, high frequency, large CMRR broadband differential amplifier.

SUMMARY OF THE INVENTION

The present invention provides high frequency, broadband differential amplifiers with large CMRR and simple topology by use of an input differential pair of dual gate field effect transistors with the second gates tied together and with a separate zero-biased field effect transistor as current source for each dual gate FET. The return path for the current sources is through the inputs (as opposed to ground) to avoid the low FET source-drain impedance as a path to ground. The output stages may be single-ended with push-pull FETs to obtain high power and good VSWR. Preferred embodiments are fabricated monolithically on gallium arsenide.

These differential amplifiers solve the problems of large CMRR in a simple topology, broadband amplifier.

BRIEF DESCRIPTION OF THE DRAWINGS

The drawings are schematic for clarity.

FIGS. 13a and 13b are simulations for the differential and common mode gains for the second preferred embodiment;

DESCRIPTION OF THE PREFERRED EMBODIMENTS

Figure 1:
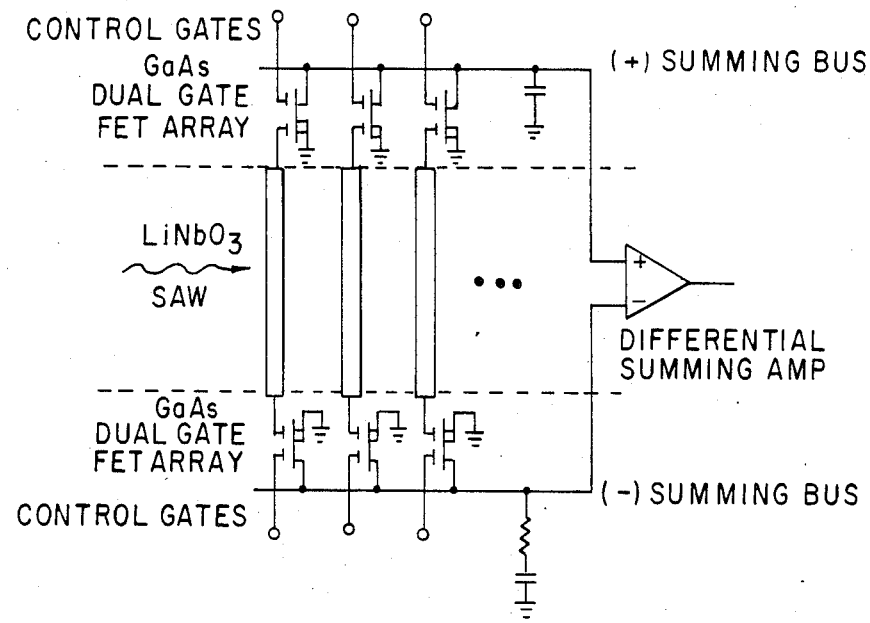
FIG. 1 is a schematic diagram of a broadband differential amplifier application.
Figure 2:
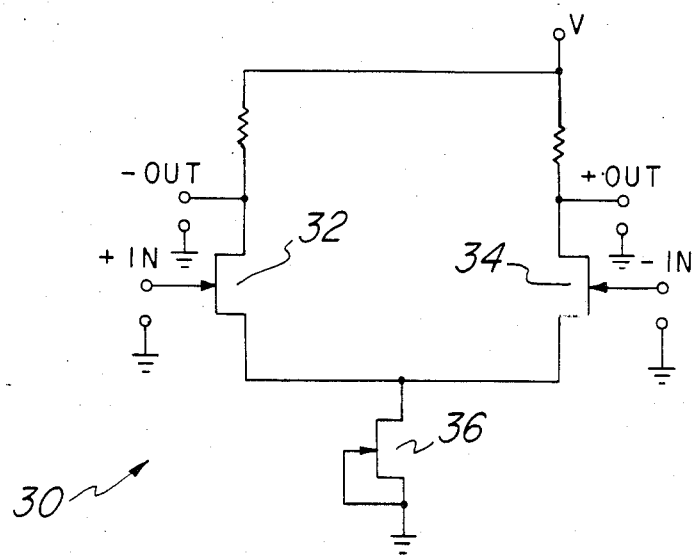
FIG. 2 is a schematic diagram of a typical differential pair.

A differential amplifier or operational amplifier input stage is typically a pair of transistors (one for each of the inputs) biased into the active region and tied together to share a common current. FIG. 2 illustrates a pair of field effect transistors (FETs) 32, 34 with their sources tied together to form a differential pair, generally denoted 30, and with zero-biased FET 36 providing the sum of the source-drain currents of FETs 32, 34. The use of FETs instead of the bipolar transistors typically found in commercial operational amplifiers is in preparation for discussion of the preferred embodiments which use gallium arsenide FETs monolithically integrated for high frequency operation. In particular, microwave FETs are typically gallium arsenide MESFETs with gates 1-2 $\mu$m long and hundreds of $\mu$m wide to provide sufficient transconductance.

Figure 3:
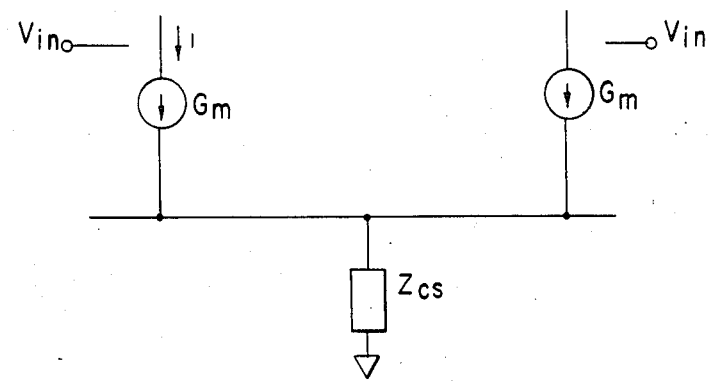
FIG. 3 is a simplified small signal equivalent circuit for the differential pair of FIG. 2.

The CMRR of stage 30 can be approximated for low frequencies ($\leq$100 MHz) from the simplified small-signal equivalent circuit shown in FIG. 3 in which $G_m$ is the transconductance of each of FETs 32, 34 and $Z_{cs}$ is the small signal impedance of the current source FET 36. The result is $$CMRR(dB) = 20 \log \left| \frac{1 + 2G_m Z_{cs}}{2} \right|$$

Figure 4:
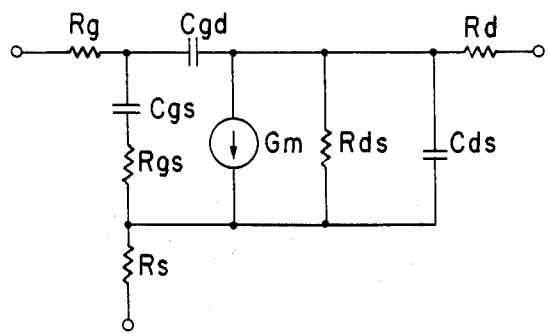
FIG. 4 illustrates a small-signal equivalent circuit for a microwave FET.

The low drain-source impedance of FET 36 provides a low impedance $Z_{cs}$ to ground and limits the CMRR to about 16 dB for typical values of $G_m$ and $Z_{cs}$ such as 10 mS and 600$\Omega$, respectively. Note that typical values of gallium arsenide microwave FET parameters are shown in FIG. 4 as a function of gate width in $\mu$m.

Figure 5:
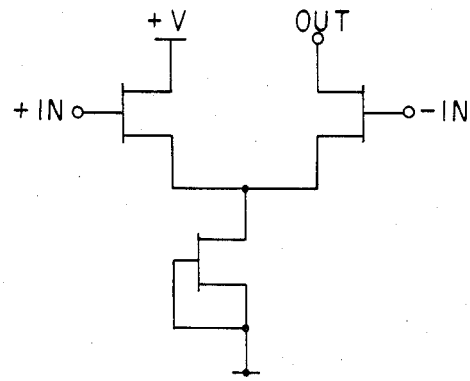
FIG. 5 illustrates connections for the differential pair of FIG. 2.
Figure 5:
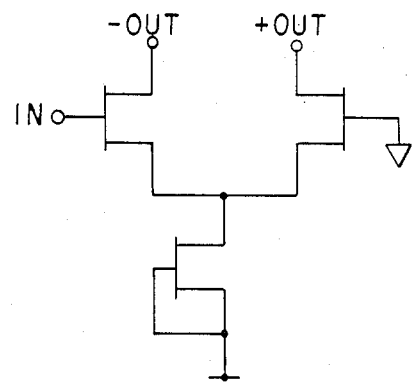
Figure 5:
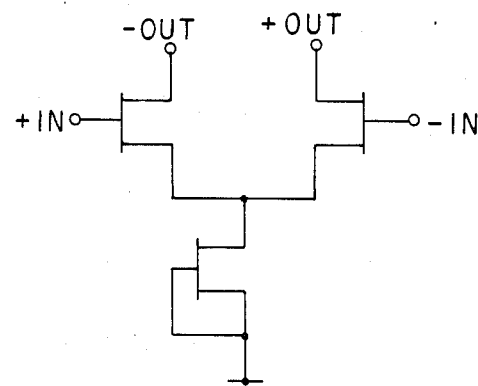

FIG. 5 illustrates some of the various connections for applications of a differential pair. Note that the differential pair may be connected as a 180 degree combiner, 180 degree splitter, or differential input/differential output amplifier as illustrated.

Figure 6:
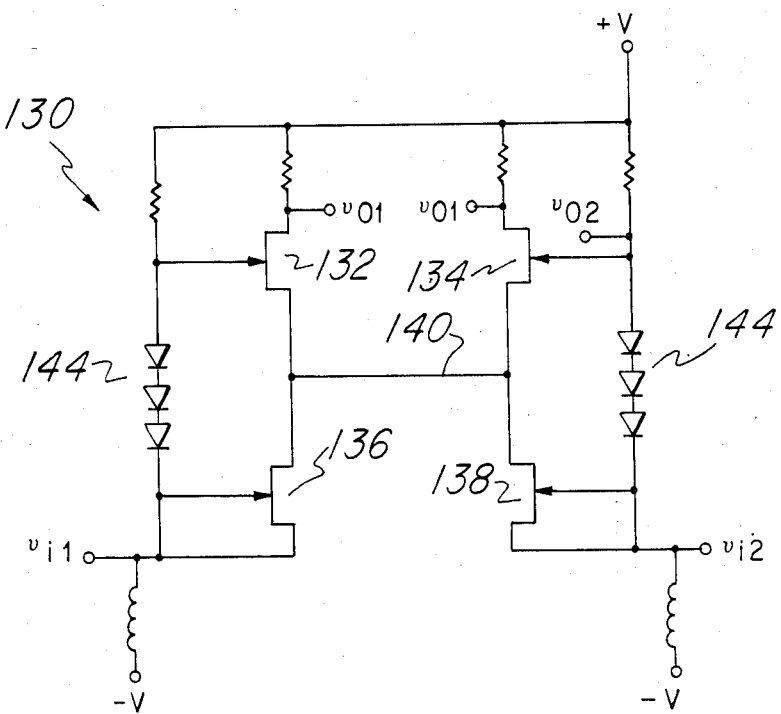
FIG. 6 is a schematic diagram of a first preferred embodiment differential pair.

A first preferred embodiment differential pair input stage, generally denoted 130 and illustrated in FIG. 6, avoids the low impedance to ground of current source 36 by using a separate current source for each FET of the differential pair and having the current sources terminate at the inputs. In particular, the differential pair is the pair of n-channel FETs 132, 134, and FET 132 has zero-biased n-channel FET 136 as current source, and FET 134 has zero-biased n-channel FET 138 as current source. The gate width of FETs 132, 134 is about three times the gate width of FETs 136, 138 which are biased at $I_{DSS}$; thus FETs 132, 134 are biased to about 33% of $I_{DSS}$. Diodes 142 and 144 shift the level of the quiescent gate voltage on FETs 132, 134 so that $V_{DS}$ of current source FETs 136, 138 leads to good current regulation. Connection 140 ties the two current sources 136, 138 together at their drains, so the differential pair FETs 132, 134 are still splitting a common source current. The inputs are at the sources of current source FETs 136, 138 and the negative voltage supply; thus there is no direct path to ground through $Z_{cs}$.

Figure 7:
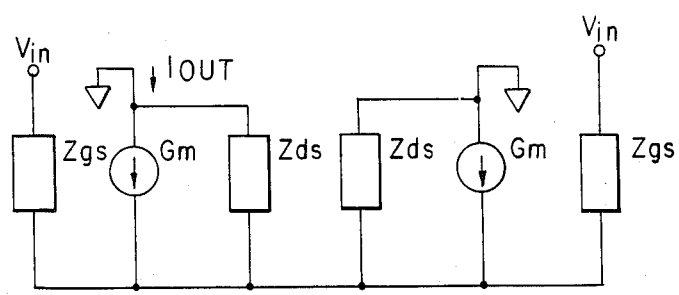
FIG. 7 is a simplified small signal equivalent circuit for the first preferred embodiment.

Approximation of the CMRR for stage 130 by calculation with the simplified small-signal equivalent circuit shown in FIG. 7 yields:

$$CMRR(dB) = 20 \log \left| \frac{G_m(Z_{ds} + Z_{gs}) + G_m^2 Z_{ds} Z_{gs}}{2} \right|$$

where $G_m$ is the transconductance of each of FETs 132, 134; $Z_{ds}$ is the drain-source impedance of each of FETs 132, 134; and $Z_{gs}$ is $Z_{cs}$ parallel $C_{gs}$ with $Z_{cs}$ the drain-source impedance of each of FETs 136, 138 and $C_{gs}$ the gate-source capacitance of each of FETs 132, 134. Thus CMRR is about 30 dB for FET parameters similar to those yielding 16 dB for stage 30. But it is apparent that parasitics internal to the differential pair 132, 134, such as the drain-source impedance, also limit the CMRR.

Figure 8:
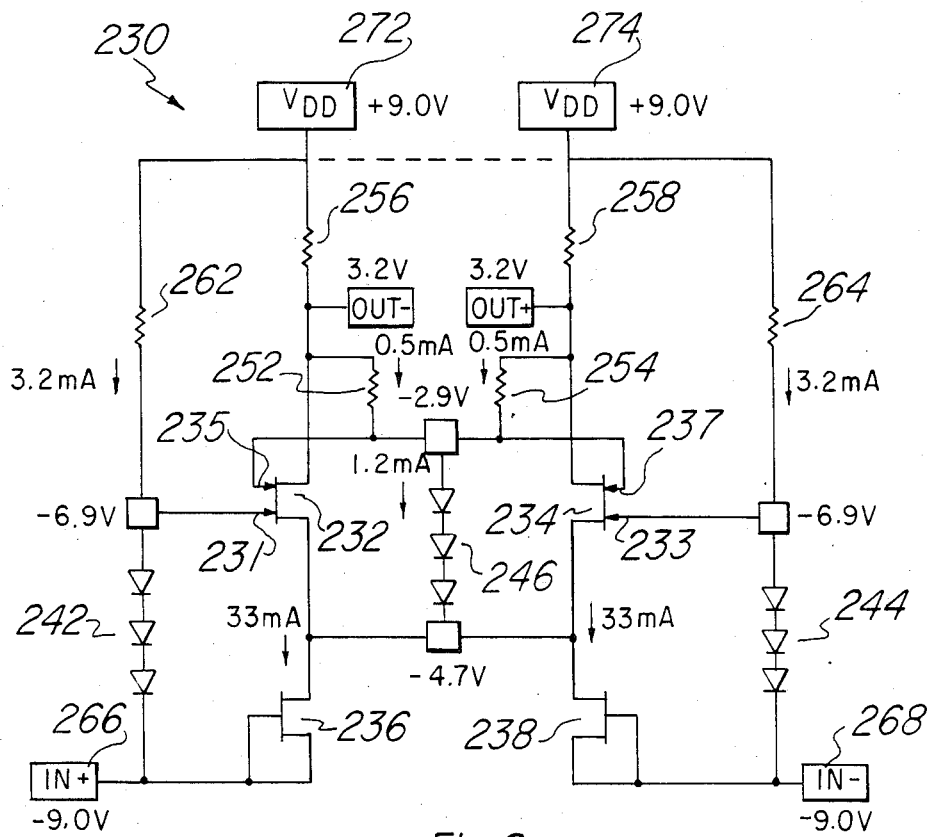
FIG. 8 is a schematic diagram of a second preferred embodiment differential pair.
Figure 9:
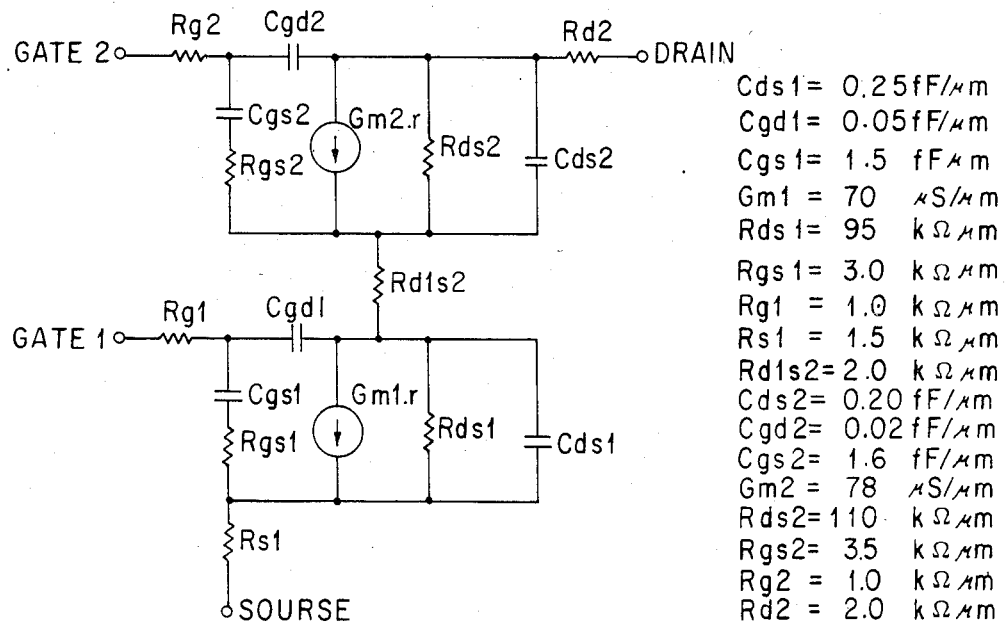
FIG. 9 illustrates a small-signal equivalent circuit for a microwave dual-gate FET.

A second preferred embodiment differential pair input stage, generally denoted 230 and illustrated in FIG. 8, overcomes the drag on CMRR from the drain-source impedance of the differential pair FETs 132, 134 of stage 130 by use of dual gate FETs for the differential pair FETs with the second gates tied together. Note that the drain-source impedance of a dual gate FET is related to the drain-source impedance of a single gate FET by:

$Z_{ds}(\text{dualgate}) \approx (G_m R_{ds} + 1)R_{ds}$, and $Z_{ds}(\text{singlegate}) \approx R_{ds}$, so using the values of the parameters in FIG. 4 shows that the dual gate drain-source impedance is about ten times the single gate drain-source impedance. In stage 230 FETs 232, 234 are dual gate MESFETs fabricated in gallium arsenide with 1.5 $\mu$m long and 300 $\mu$m wide gates with the gates separated by 2 $\mu$m; FIG. 9 is a small-signal equivalent circuit for FETs 232, 234 modeled as two single gate FETs cascode connected and with the parameters expressed as functions of the gate width. The stage 230 also includes gallium arsenide MESFETs 236, 238 with 1.5 $\mu$m long and 100 $\mu$m wide gates with the gates connected to the sources so that these FETs act as current sources for FETs 232, 234; diode stacks 242, 244 each of three diodes which shift the level at first gates 231, 233 of FETs 232, 234, respectively, up 2.1 V relative to the sources of FETs 236, 238; diode stack 246 of three diodes which shifts the level of second gates 235, 237 of FETs 232, 234, respectively, relative to the sources of the FETs by 2.1 V; 10 k$\Omega$ bias resistors 252, 254; 175$\Omega$ load resistors 256, 258; 5 k$\Omega$ bias resistors 262, 264; 9.0 V power supplies 272, 274; and $-9.0$ V power supplies 266, 268. The two inputs are at power supplies 266, 268, and the two outputs are between load resistors 256, 258 and the drains of FETs 232, 234. The diodes in the stacks 242, 244, 246 all have anodes of 100 $\mu$m by 1.5 $\mu$m.

Figure 10:
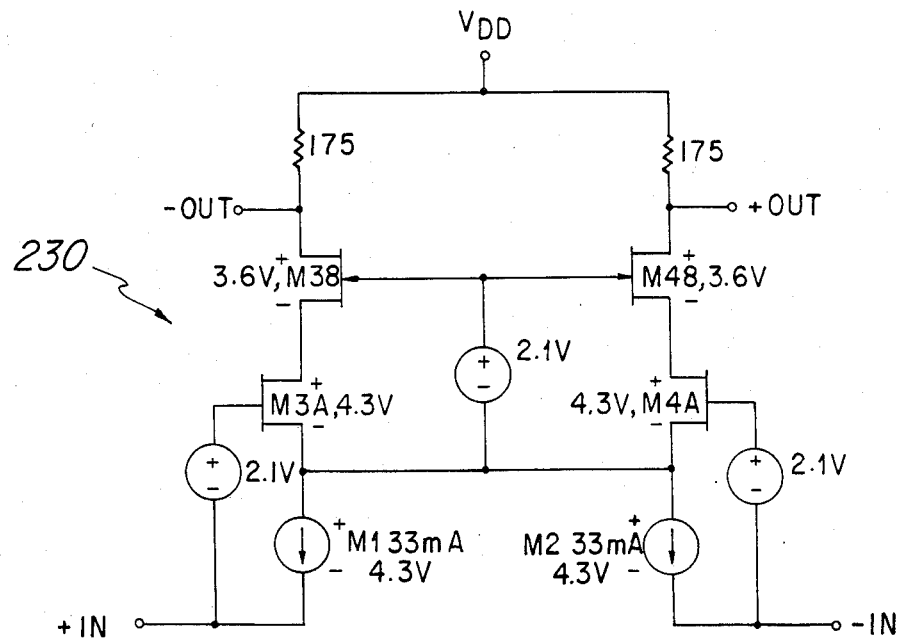
FIG. 10 is a simplified schematic diagram for the second preferred embodiment.
Figure 11:
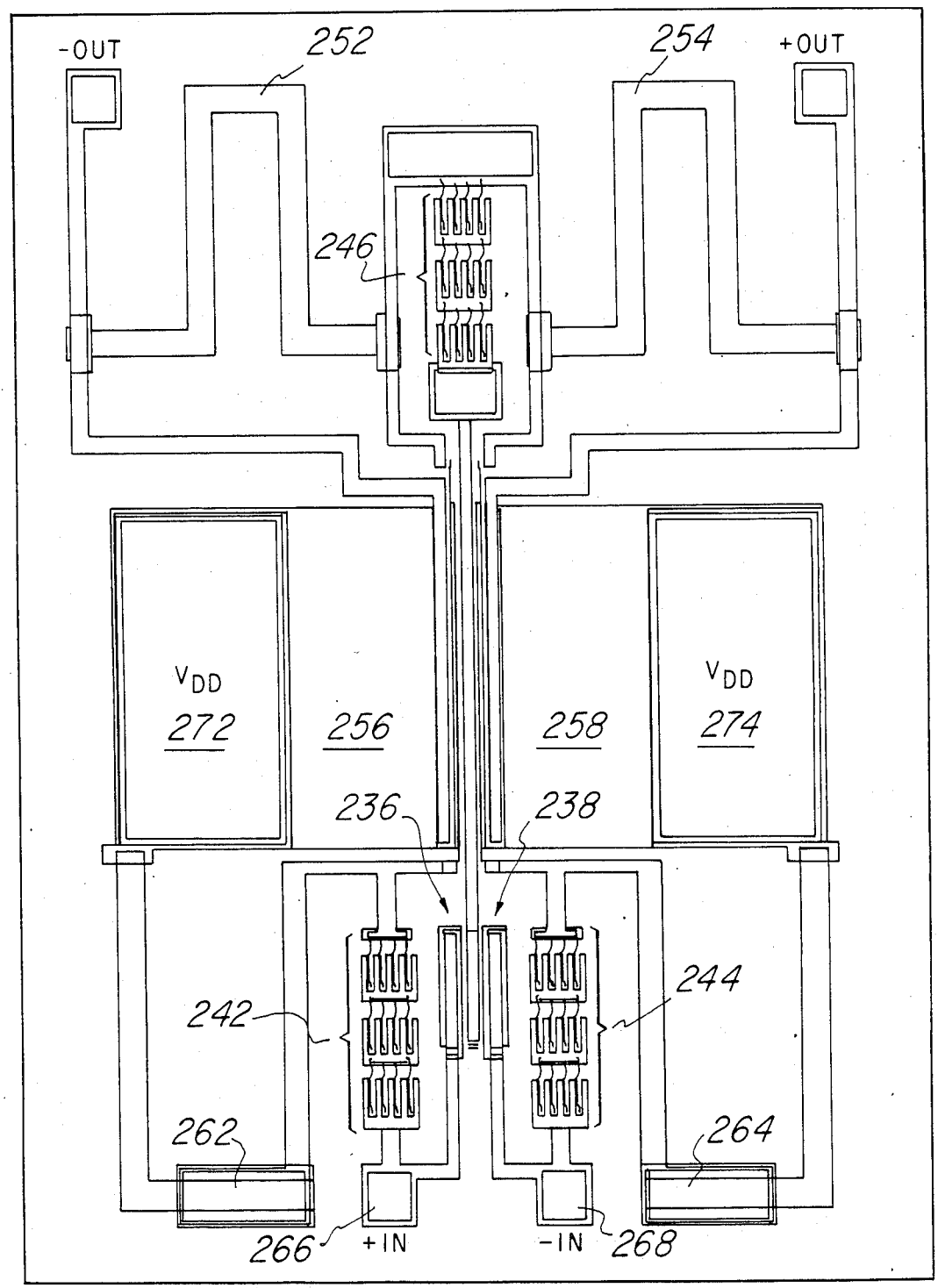
FIG. 11 is a layout for the second preferred embodiment.

FIG. 10 is a simplified schematic diagram of stage 230; and FIG. 11 a layout for stage 230. The quiescent voltages and currents are as indicated in FIG. 10; current source FETs 236, 238 each operate at $I_{DSS}$, which equals 33 mA, and thereby biases differential FETs 232, 234 to operate at 33% of $I_{DSS}$ because the gates of FETs 232, 234 are three times as wide as the gates of FETs 236, 238. Diode stacks 242, 244 raise the $V_{DS}$ of current source FETs 236, 238 to about 4.3 V (because $V_{G1S}$ for FETs 232, 234 equals $-2.2$ V for $I_{DS} = 33\% I_{DSS}$) which insures good current source operation. Diode stack 246 raises the $V_{G2S}$ to about 2.1 V to maximize $Z_{ds}$ of the dual-gate FETs 232, 234.

Stage 230 may be fabricated monolithically on semi-insulating (chromium doped) GaAs as follows. First, the active areas are formed by ion implantation with silicon to a concentration of $2 \times 10^{17}/cm^3$ to a depth of 0.4 μm. Next, the active areas are isolated as mesas, and Ti/Pt/Au deposited. The FET gates and diode anodes are defined in the Ti/Pt/Au by optical lithography and formed by plasma etching. Note that the resistivity of the active area is about $10^{-2}$Ω-cm, so the sheet resistance is about 400Ω/□ and the bias resistors may be meanders in the active area; see FIG. 11. Ohmic contacts are formed by liftoff of gold/germanium/nickel; and passivation is by plasma deposition of $Si_3N_4$.

Figure 12:
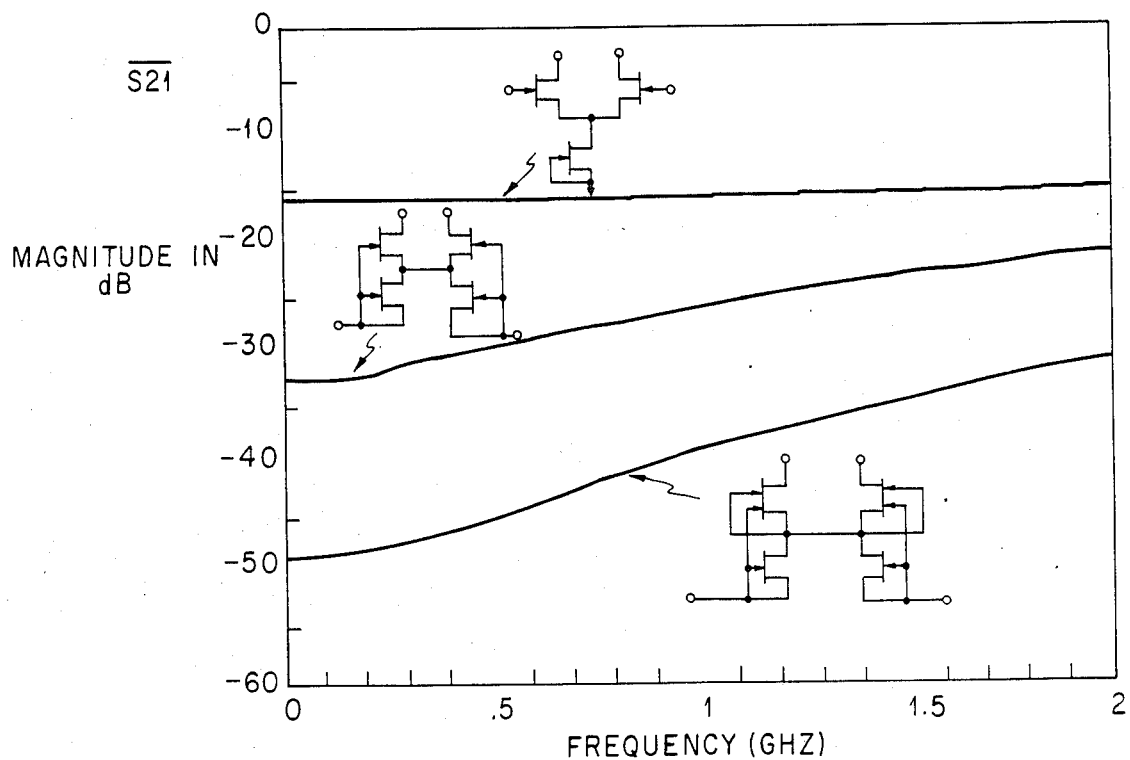
FIG. 12 compares the CMRR for the first and second preferred embodiments.
Figure 13A:
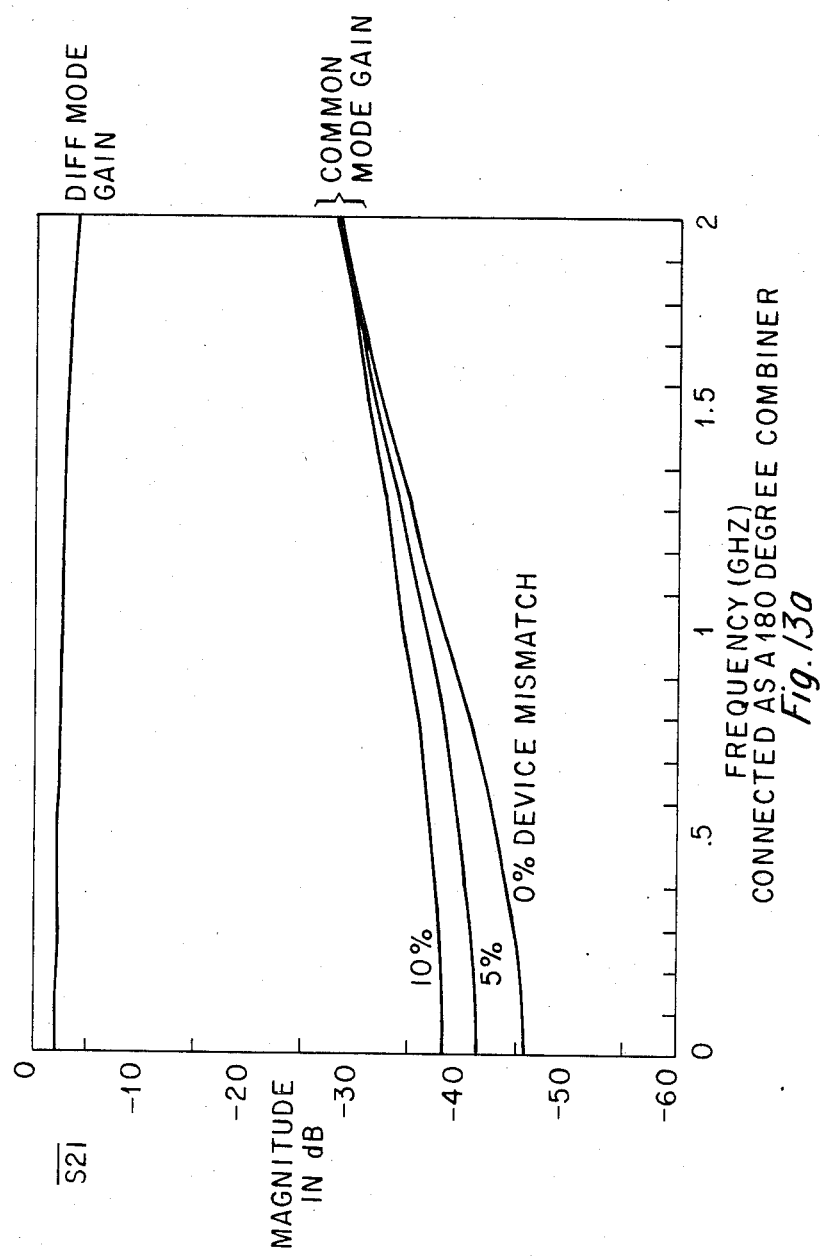

FIG. 12 are simulations that compare the CMRR of differential pair stages 30, 130, and 230 up to 2 GHz. For the simulations, the out-puts were presumed connected to microstrip transmission lines with characteristic impedances of 50Ω and matched loads and the inputs were presumed to have generator impedances of 50Ω. FIG. 13a shows the differential mode and common mode gain up to 2 GHz and for mismatches of 0%, 5%, and 10% of FETs 232, 234 for stage 230 connected as a 180 degree combiner; and FIG. 13b shows the same data for connection as a 180 degree splitter. The relative insensitivity of the CMRR to device mismatch is apparent. The curves of FIGS. 12 and 13a and 13b are simulations based on the equivalent circuits of FIGS. 4 and 9. Note that at low frequencies (<100 MHz) the −9.0 V power supplies (which supply current through an inductor) may provide a low impedance to ground, so the corresponding portion of FIGS. 12 and 13A-B would be modified.

Figure 14:
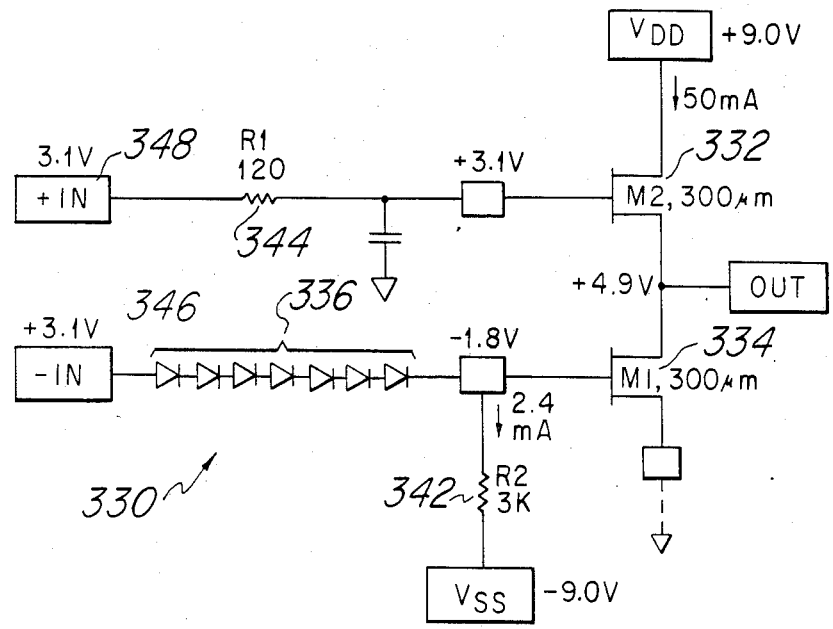
FIG. 14 is a schematic for a preferred embodiment push-pull differential amplifier.
Figure 15:
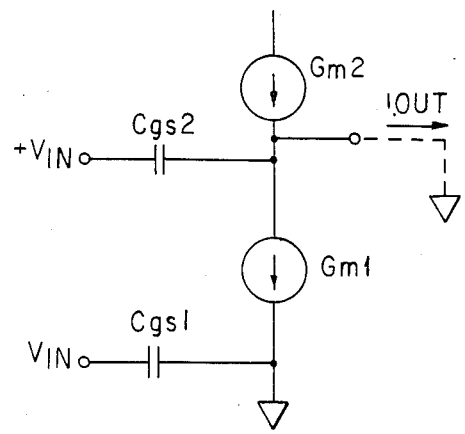
FIG. 15 is a simplified small-signal equivalent circuit for the push-pull amplifier.

FIG. 14 is a schematic diagram of a push-pull differential amplifier, generally denoted 330, with single-ended output, and FIG. 15 is a simplified small-signal equivalent circuit for amplifier 330. Amplifier 330 is fabricated in gallium arsenide analogous to stages 130 and 230 and includes FETs 332, 334 with 1.5 μm long and 300 μm wide gates, diode stack 336 of seven diodes with anodes 1.5 μm by 300 μm, 3 kΩ resistor 342, and 120Ω resistor 344. Diodes 336 shift the inverting input 346 to the same quiescent level as the noninverting input 348; namely 3.1 V. The quiescent output level is 4.9 V. The CMRR calculated from FIG. 15 is $$CMRR(dB) \approx -10 \log \left| \frac{\Delta G_m^2}{G_m} + \frac{F}{F_t} \right|$$

where $\Delta G_m = G_{m2} - G_{m1}$, $G_m = (G_{m2} + G_{m1})/2$, and $F_t = G_m/2\pi C_{gs2}$. Thus with perfectly matched devices, the CMRR at zero frequency is infinite; however, small device mismatch significantly degrades CMRR. For example, a 10% mismatch in transconductance leads to a CMRR of 20 dB. High frequency CMRR is limited by current fed through $C_{gs2}$ and gives rise to the $F/F_t$ term. For example, at a frequency of 10% of $F_t$ (typically about 1 GHz), CMRR is about 20 dB.

Figure 16:
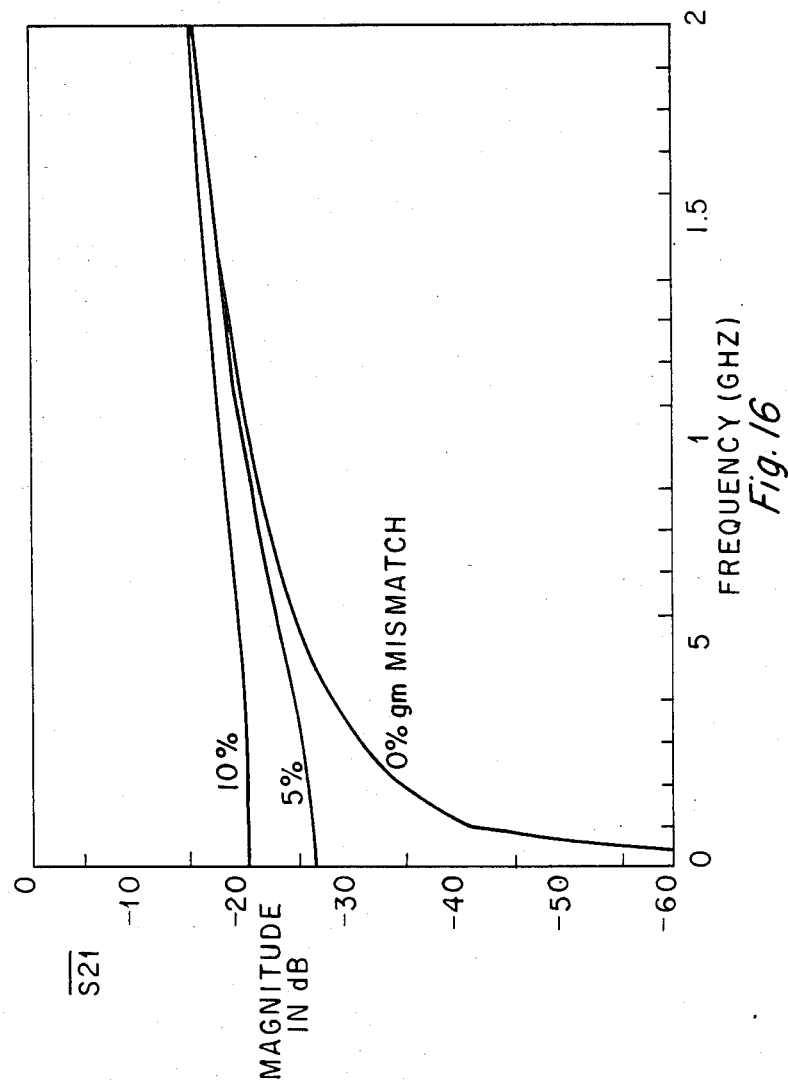
FIG. 16 are simulations for the differential and common mode gains for the push-pull amplifier.

FIG. 16 shows a simulation for amplifier 330 CMRR based on the FET small-signal equivalent circuit of FIG. 4 with 300 μm wide and 1.5 μm long gates and seven diodes 336 with anodes 100 μm by 1.5 μm and drawing 2.4 mA bias current. For the simulations the output was presumed connected to a microstrip transmission line with 50Ω characteristic impedance and terminated by a matched load, and the inputs were similarly presumed from a generator with 50Ω impedance; note that the inputs also are 3.1 V power supplies which have large chokes to prevent a-c shorting to ground. Simulations also indicate output VSWR for amplifier 330 is less than 2:1 up to 2 GHz and power output is about 20 dBm at 1 dB compression.

Figure 17:
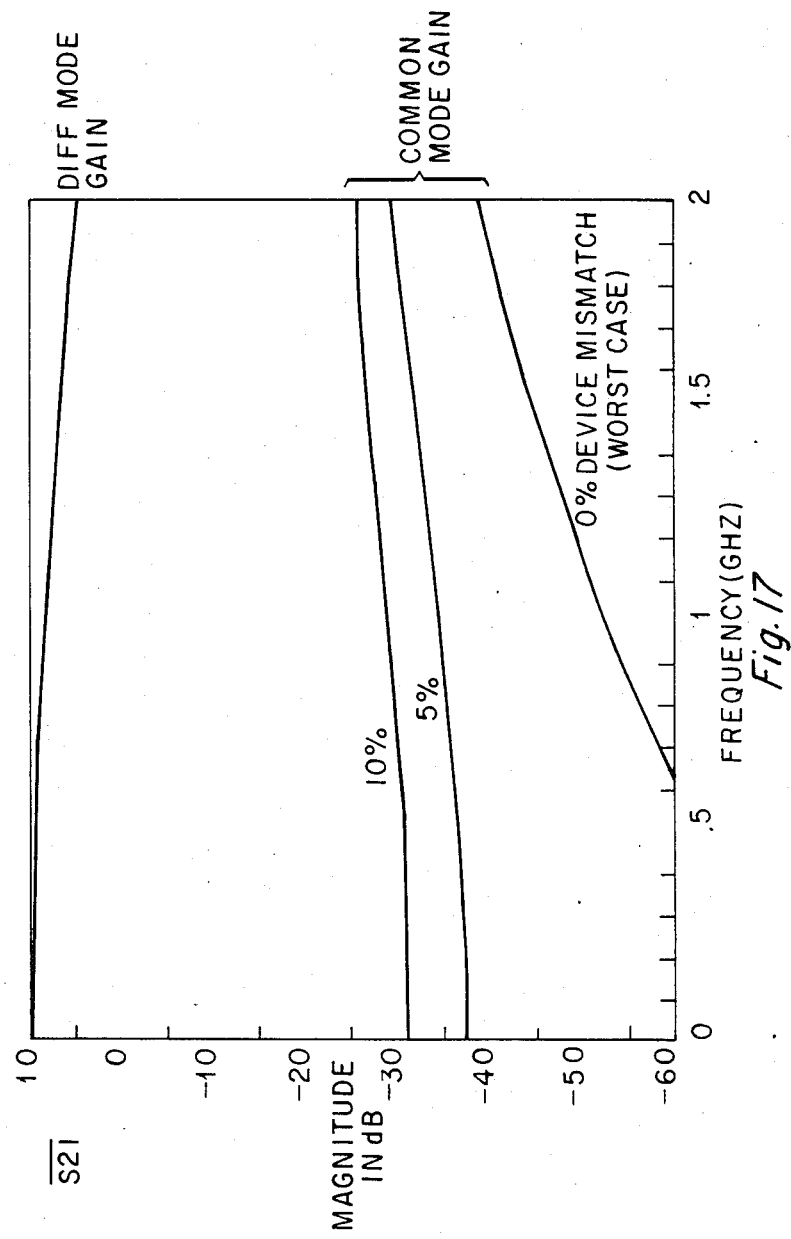
FIG. 17 are simulations for the second preferred embodiment cascaded with the push-pull amplifier.

Differential pair input stage 230 can be directly cascaded with push-pull amplifier 330 and the resulting two stage amplifier has about 10 dB differential-mode gain (note that the outputs of stage 230 are loaded by push-pull 330 inputs and not 50Ω) and CMRR of at least 35 dB even for 10% device mismatch. FIG. 17 shows simulation results for the cascaded amplifier and indicates the dependence of CMRR on mismatch.

MODIFICATIONS AND ADVANTAGES

Figure 18A:
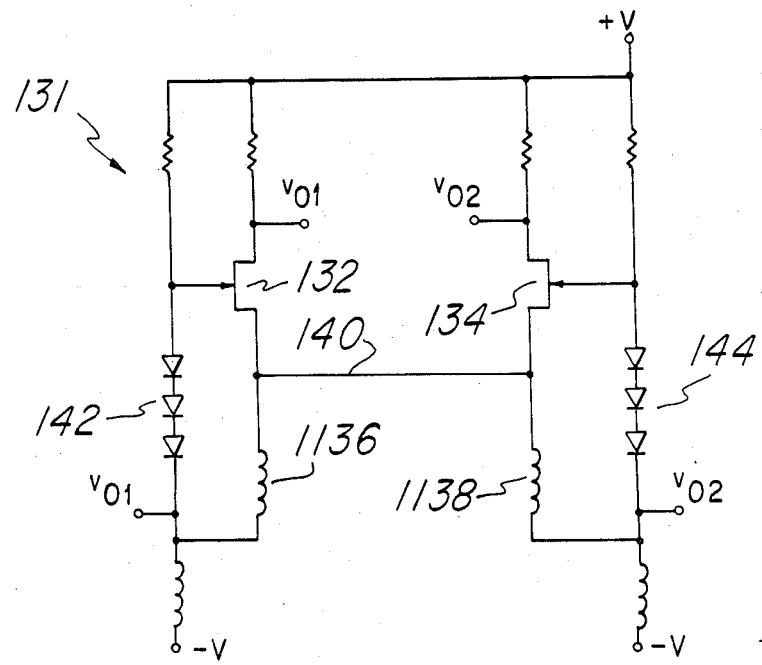
FIGS. 18a and 18b and 19a and 19b are variations of the first and second preferred embodiments with inductor current sources.
Figure 18B:
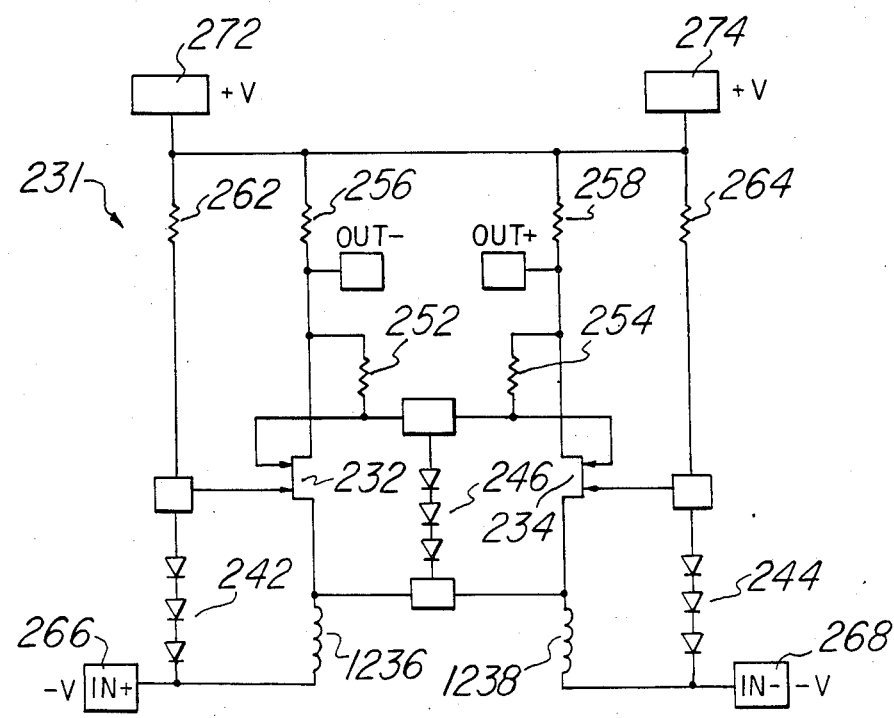
Figure 19A:
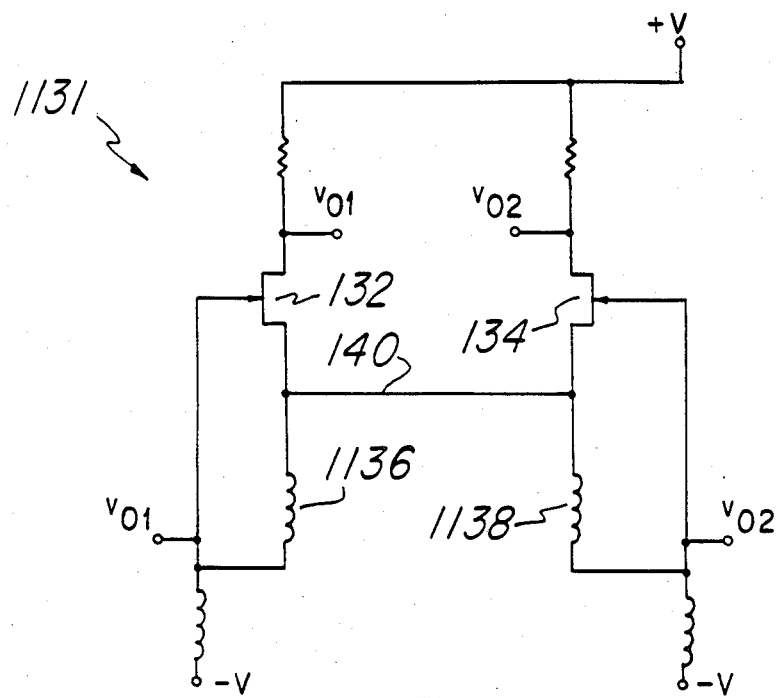
Figure 19B:
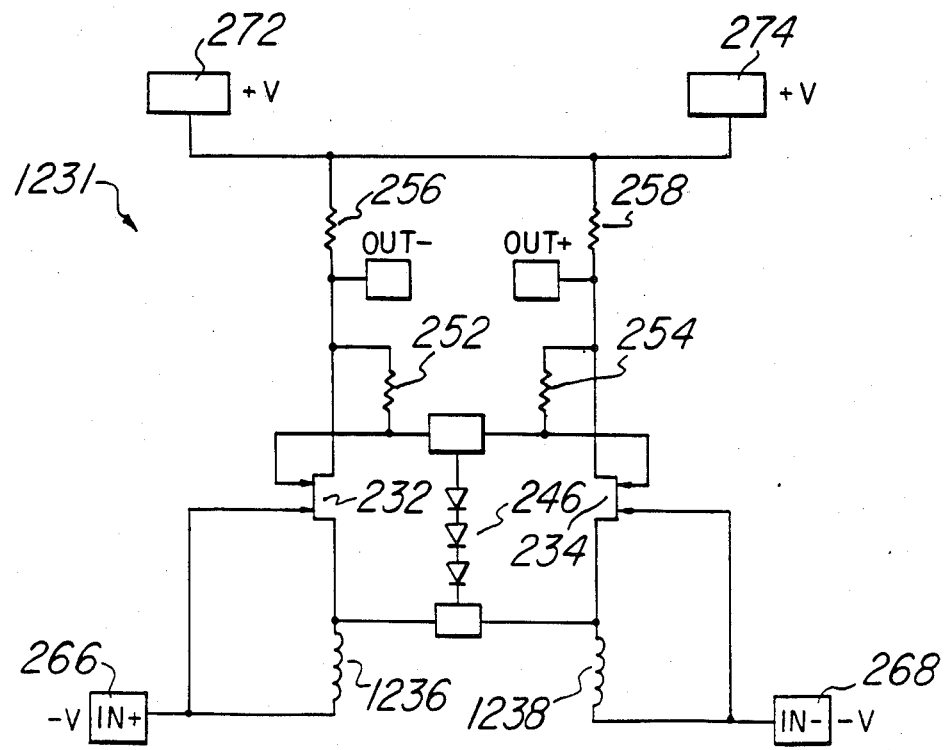

Various modifications of the preferred embodiment amplifiers may be made while retaining the separate current sources coupled to the differential inputs feature of the amplifiers. For example, the dimensions and shapes of the FETs can be varied such as shorter and wider gates; the materials can be varied such as silicon instead of gallium arsenide substrate and aluminum instead of titanium/platinum/gold gates and anodes; the FETs can be replaced in whole or in part by bipolar or even heterojunction bipolar transistors; the push-pull output stage can be replaced by a differential output stage; and differential amplifier stages can be inserted between the differential input and the output stage to increase the overall gain. For higher frequency operation, the separate current sources could be inductors; such inductors could be fabricated as microstrip transmission lines on a gallium arsenide substrate. FIGS. 18a and 18b illustrate such inductor current sources. In particular, FIG. 18a shows amplifier 131 which is the same as amplifier 130 except that MESFET 136 has been replaced by inductor 1136 and MESFET 138 has been replaced by inductor 1138; and FIG. 18b shows amplifier 231 which is the same as amplifier 230 except that MESFET 236 has been replaced by inductor 1236 and MESFET 238 has been replaced by inductor 1238. Because the inductor current sources need not be biased as do the MESFETs, diode stacks 142 and 144 may be eliminated and the bias resistors removed in the differential pair of FIG. 18a and diode stacks 242 and 244 plus bias resistors 262 and 264 may be eliminated in the differential pair of FIG. 18b. The resulting preferred embodiment differential pairs 1131 and 1231 are illustrated in FIGS. 19a and 19b respectively, with elements in pairs 1131 and 1231 corresponding to elements in pairs 130, 230, 131, and 231 given the corresponding reference numerals.

The advantages of the present invention include a simple topology for a broadband, high CMRR differential amplifier.

What is claimed is:
1. A differential amplifier, comprising:
   (a) first and second field effect transistors, the sources of said transistors electrically connected;
   (b) first and second inputs electrically connected to the gates of said first and second transistors, respectively;
   (c) a first current source electrically connected from said first transistor source to said first input;
   (d) a second current source electrically connected from said second transistor source to said second input; and
   (e) first and second outputs connected to the drains of said first and second transistors, respectively.
2. The amplifier of claim 1, further comprising:

(a) level shifting diodes between said first input and said first transistor gate and between said second input and said second transistor gate.

3. The amplifier of claim 2, wherein:
(a) said current sources are zero-biased field effect transistors.

4. The amplifier of claim 1, wherein:
(a) said current sources are inductors.

5. The amplifier of claim 1, wherein:
(a) said first and second field effect transistors are both dual gate field effect transistors with the second gate of said first field effect transistor connected to the second gate of said second field effect transistor.

6. The amplifier of claim 1, wherein:
(a) said field effect transistors are all MESFETs with gallium arsenide semiconductor.

7. The amplifier of claim 1, further comprising:
(a) a push-pull single-ended output stage with inputs connected to said first and second outputs.

8. The amplifier of claim 7, wherein:
(a) said push-pull stage includes third and fourth field effect transistors connected in series and with at least one of the gates of said third and fourth transistors level shifted to form said stage inputs.

9. A broadband differential amplifier, comprising:
(a) first and second input terminals, each of said terminals with a predetermined first dc potential;
(b) an output terminal;
(c) a first differential amplifying circuit including first and second MESFETs, the gates of said first and second MESFETs connected through level shifters to said first and second input terminals, respectively, and the sources of said MESFETs connected together;
(d) a first current source connected between the source of said first MESFET and said first input;
(e) a second current source connected between the source of said second MESFET and said second input; and
(f) a load circuit for said MESFETs and connected from the drains of said MESFETs to said output terminal.

10. The amplifier of claim 9, wherein:
(a) said load circuit includes third and fourth MESFETs push-pull connected with the gates of said third and fourth MESFETs connected through at least one level shifter to the drains of said first and second MESFETs, respectively.

11. The amplifier of claim 10, wherein:
(a) said first and second MESFETs are each dual gate MESFETs with the second gates connected together and connected through a level shifter to the sources of said first and second MESFETs.

12. The amplifier of claim 10, wherein:
(a) said MESFETs, load circuit, and level shifters are made of gallium arsenide and metal.

* * * * *